(12) United States Patent
Katsuno et al.

(10) Patent No.: US 8,581,313 B2
(45) Date of Patent: Nov. 12, 2013

(54) SOLID-STATE IMAGING DEVICE

(75) Inventors: Motonari Katsuno, Kyoto (JP);
Masayuki Takase, Osaka (JP); Tetsuya Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/428,017

(22) Filed: Mar. 23, 2012

(65) Prior Publication Data
US 2012/0267739 A1 Oct. 25, 2012

(30) Foreign Application Priority Data

Apr. 22, 2011 (JP) ................................ 2011-096167

(51) Int. Cl.
*H01L 31/062* (2012.01)
(52) U.S. Cl.
USPC ........... 257/292; 257/294; 257/414; 257/432; 257/466; 257/E31.127
(58) Field of Classification Search
None
See application file for complete search history.

(56) References Cited

U.S. PATENT DOCUMENTS

| | | | | |
|---|---|---|---|---|
| 7,973,271 B2 * | 7/2011 | Toumiya et al. | ........... | 250/208.1 |
| 2004/0000669 A1 | 1/2004 | Yamamura | | |
| 2005/0116271 A1 * | 6/2005 | Kato | ............................ | 257/292 |
| 2007/0075343 A1 | 4/2007 | Yamamura | | |
| 2008/0135732 A1 | 6/2008 | Toumiya et al. | | |
| 2010/0025571 A1 | 2/2010 | Toumiya et al. | | |
| 2010/0136738 A1 | 6/2010 | Yamamura | | |

FOREIGN PATENT DOCUMENTS

| | | |
|---|---|---|
| JP | 2003-282851 | 10/2003 |
| JP | 2003-324189 | 11/2003 |
| JP | 2007-088306 | 4/2007 |
| JP | 2008-166677 | 7/2008 |
| JP | 2011-023481 | 2/2011 |

* cited by examiner

*Primary Examiner* — Dung Le
(74) *Attorney, Agent, or Firm* — Panasonic Patent Center

(57) ABSTRACT

There is employed a lamination structure of semiconductor substrate in which light receiving part having a photoelectric converting function is formed in an inner portion, and insulating films and wirings. There are provided a wiring layer formed above semiconductor substrate and having a concave portion formed in a place corresponding to a portion disposed above light receiving part, second insulating film having a higher refractive index than insulating films and covering a side surface of the wiring layer facing the concave portion, third insulating film having a lower refractive index than second insulating film and covering the side surface of second insulating film, and fourth insulating film having a higher refractive index than third insulating film and covering the side surface of third insulating film.

9 Claims, 7 Drawing Sheets

SOLID-STATE IMAGING DEVICE

BACKGROUND

1. Field of the Invention

The present invention relates to a solid-state imaging device, and more particularly to a structure of a waveguide above a light receiving part.

2. Description of the Related Art

A solid-state imaging device is used as an imaging device such as a digital still camera or a video camera. For example, a CMOS (Complementary Metal Oxide Semiconductor) sensor to be a type of a solid-state imaging device has a pixel region and a peripheral circuit region formed on a periphery thereof by defining a semiconductor substrate as a base. A plurality of photodiodes is formed in the pixel region. The photodiodes are provided corresponding to respective pixel parts and are disposed in a matrix along a main surface in a surface layer of the semiconductor substrate, for example.

A structure of a pixel region in a solid-state imaging device according to the related art will be described with reference to FIG. 7 by taking the structure disclosed in Japanese Patent No. 4117672 as an example.

As shown in FIG. 7, in a pixel part of the solid-state imaging device according to the related art, photodiode 903 is formed on a surface layer portion of one of main surfaces (a main surface on an upper side in a Z-axis direction) of semiconductor substrate 901. Insulating film 907 is provided on semiconductor substrate 901, and insulating films 909 and 911 are further provided thereon in sequence. Diffusion preventing films 908, 910 and 912 are formed between insulating film 907 and insulating film 909, between insulating film 909 and insulating film 911, and on insulating film 911, respectively. Moreover, wirings 913, 914 and 915 are formed downward in the Z-axis direction from boundary surfaces between insulating films 907, 909 and 911 and diffusion preventing films 908, 910 and 912, respectively.

A wiring layer to be a laminated product formed by insulating films 907, 909 and 911 and wirings 913, 914 and 915, and furthermore, diffusion preventing films 908, 910 and 912 has a concave portion formed in a place corresponding to a portion provided above photodiode 901. Passivation film 917 formed to cover diffusion preventing film 912 is formed to fill in the concave portion provided on the wiring layer. Passivation film 917 has a higher refractive index than insulating films 909 and 911, and incident light $L_{91}$ is reflected by interface 917sf between passivation film 917 and insulating films 909 and 911 so that a leakage of light to the wiring layer is prevented to some degree. In other words, passivation film 917 is set to have a higher refractive index than insulating films 909 and 911 to constitute an optical waveguide above photodiode 903. Consequently, a light collection is carried out at a high efficiency.

SUMMARY

In the solid-state imaging device according to the related art, however, a leakage of light (an evanescent wave) from the optical waveguide to the wiring layer occurs, which causes a problem when a light collection efficiency is to be further enhanced. Moreover, there is also a problem in that the light leaking to the wiring layer is scattered by wirings 914 and 915 formed by a metallic material and thus enters an adjacent pixel part or the like. These problems are particularly troublesome in a progress of a refinement of a pixel size.

The present invention provides a solid-state imaging device having a high light collection efficiency and a high sensitivity.

Therefore, the present invention employs the following structure.

The solid-state imaging device according to the present invention includes a semiconductor substrate, a wiring layer, a second insulating film, a third insulating film and a fourth insulating film.

The semiconductor substrate includes a light receiving part having a photoelectric converting function therein.

The wiring layer has a laminating structure of a first insulating film and a wiring, is formed above the semiconductor substrate and has a concave portion formed in a place corresponding to a portion provided above the light receiving part.

The second insulating film has a higher refractive index than the first insulating film in the wiring layer and is formed in such a state as to cover at least a side surface of the wiring layer facing the concave portion provided on the wiring layer.

The third insulating film has a lower refractive index than the second insulating film and is formed in such a state as to cover at least a side surface of the second insulating film corresponding to the side surface of the wiring layer facing the concave portion provided on the wiring layer.

The fourth insulating film has a higher refractive index than the third insulating film and is formed in such a state as to cover at least the side surface of the third insulating film corresponding to the side surface of the second insulating film.

In a solid-state imaging device according to the present invention, the second insulating film, the third insulating film and the fourth insulating film are formed in a lamination in sequence on the side surface of the wiring layer facing the concave portion provided on the wiring layer. The second insulating film has a higher refractive index than the first insulating film in the wiring layer, and furthermore, the fourth insulating film has a higher refractive index than the third insulating film. In the solid-state imaging device according to the present invention, therefore, even if a part of light incident on the concave portion advances toward the wiring layer, the light is reflected toward an inner side of a waveguide by both an interface between the fourth insulating film and the third insulating film and an interface between the second insulating film and the first insulating film in the wiring layer.

Therefore, the solid-state imaging device according to the present invention can implement a higher light collection efficiency and has a higher sensitivity as compared with the solid-state imaging device according to the related art.

For example, the solid-state imaging device according to the present invention can employ the following variation structure, for example.

In the solid-state imaging device according to the present invention, it is preferable that the second insulating film should be formed in such a state as to also cover a bottom surface of the concave portion in the wiring layer and the third insulating film should be formed in such a state as to also cover a bottom surface of the second insulating film corresponding to the bottom surface of the concave portion in the wiring layer. It is preferable that the fourth insulating film should be formed in such a manner as to also cover a bottom surface of the third insulating film corresponding to the bottom surface of the second insulating film. Referring to the bottom surface of the wiring layer facing the concave portion, the second insulating film, the third insulating film and the fourth insulating film do not need to be always formed in a lamination. By employing the structure, however, it is not necessary to remove each insulating film in a portion corresponding to the bottom surface of the wiring layer facing the concave portion. Thus, the structure is excellent in respect of a manufacturing cost.

In the solid-state imaging device according to the present invention, it is preferable that the fourth insulating film should be formed in such a state as to fill in a residual concave portion on an inside of the side surface of the third insulating film and a place corresponding to a portion provided above the light receiving part should be formed to take an upward convex shape in the concave portion of the wiring layer. Consequently, a condenser lens is formed between a portion formed to take the upward convex shape in the fourth insulating film and a layer formed in a lamination thereon. Therefore, it is possible to implement a further high light collection efficiency and to enhance a sensitivity still more.

In the solid-state imaging device according to the present invention, it is preferable that a grid-shaped partition wall having an opened place corresponding to a portion disposed above the light receiving part should be provided on the fourth insulating film, and a color filter should be embedded in an inner portion of the opening. Therefore, the color filters of adjacent pixel parts are divided through the partition wall. Thus, it is also possible to prevent light from leaking between the color filters. Consequently, it is possible to implement a further higher light collection efficiency.

In the solid-state imaging device according to the present invention, it is preferable that the fourth insulating film should have a higher refractive index than the color filter. Consequently, it is possible to effectively prevent light from leaking from the fourth insulating film into the color filter. Thus, the present invention is further effective in respect of a confinement of light into an optical waveguide.

In the solid-state imaging device according to the present invention, it is preferable that the partition wall should be formed of an oxide.

In the solid-state imaging device according to the present invention, it is preferable that the second insulating film should be formed of silicon nitride (SiN).

In the solid-state imaging device according to the present invention, it is preferable that the fourth insulating film should be formed of silicon nitride (SiN).

In the solid-state imaging device according to the present invention, it is preferable that the third insulating film should be formed of silicon oxide ($SiO_2$) or silicon oxynitride (SiON).

The second insulating film formed of the silicon nitride has a refractive index of n=2.0, and has the highest refractive index in the insulating films to be used in a semiconductor element. Moreover, the third insulating film formed of the silicon oxynitride has a refractive index of n=1.75. In the case in which the third insulating film is formed of the silicon oxide, the third insulating film has a refractive index of n=1.45. Consequently, the solid-state imaging device according to the present invention has each insulating film formed by the material described above. Thus, it is possible to effectively suppress a leakage of light into the wiring layer.

DETAILED DESCRIPTION OF THE PREFERRED EMBODIMENT

Modes for carrying out the present invention will be described below with reference to the drawings. Each of exemplary embodiments which will be described below is an example to be used for easy understanding of a structure of the present invention and functions and effects produced therefrom, and the present invention is not restricted to any of the following modes other than essential features.

First Exemplary Embodiment

1. Whole Structure of Solid-State Imaging Device 1

A whole structure of solid-state imaging device 1 according to a first exemplary embodiment will be described with reference to FIG. 1.

Figure 1:
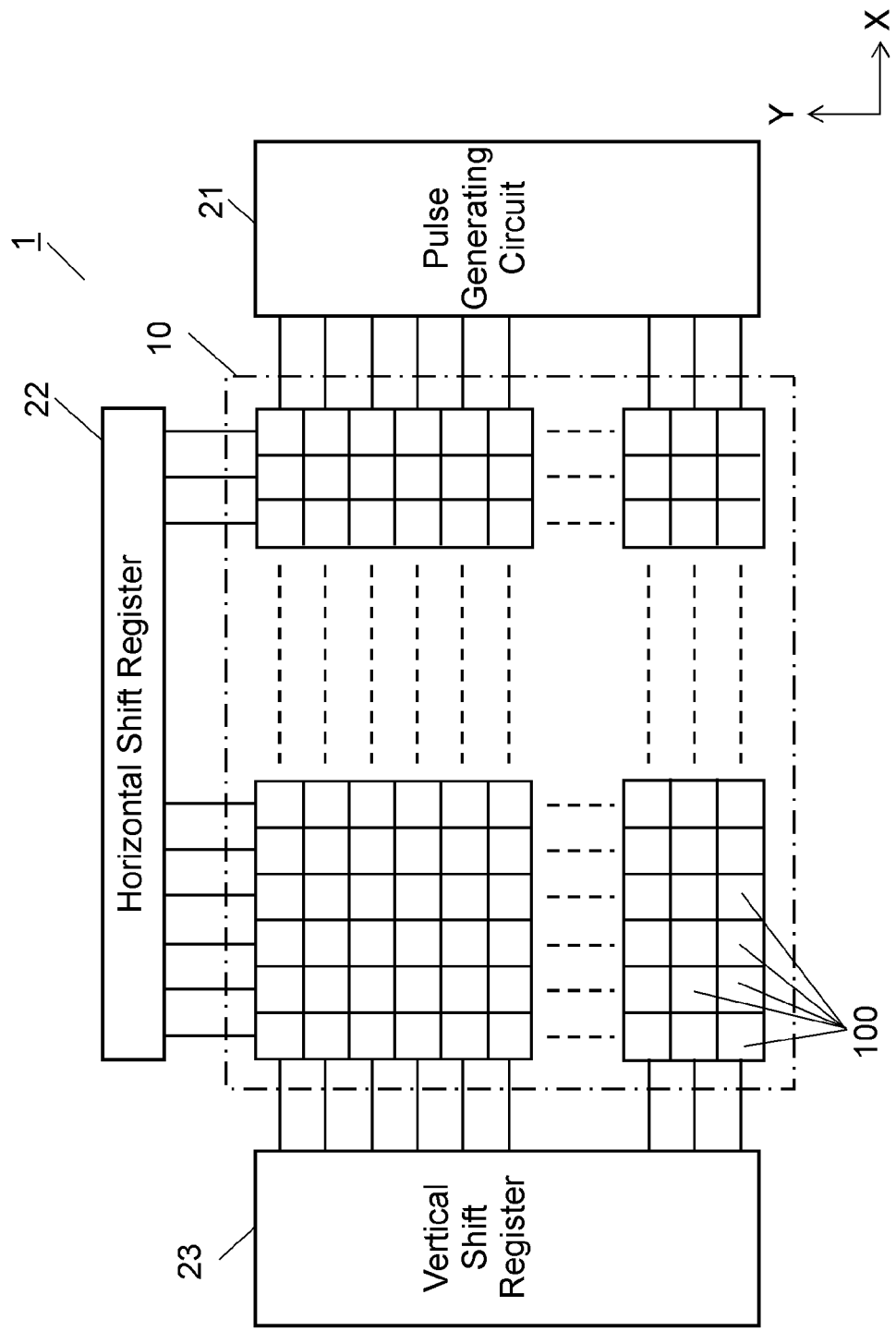
FIG. 1 is a schematic block diagram showing a whole structure of solid-state imaging device 1 according to a first exemplary embodiment of the invention.

As shown in FIG. 1, in solid-state imaging device 1 according to the first exemplary embodiment, a plurality of pixel parts 100 is arranged in a matrix (a line) along an X-Y plane so that pixel region 10 is constituted. Pulse generating circuit 21, horizontal shift register 22 and vertical shift register 23 which are provided on a periphery thereof are connected to pixel region 10. Horizontal shift register 22 and vertical shift register 23 sequentially output a driving pulse to each pixel part 100 in response to an application of a timing pulse from pulse generating circuit 21.

2. Structure in Pixel Part 100 of Solid-State Imaging Device 1

A structure in pixel part 100 of solid-state imaging device 1 will be described with reference to FIG. 2.

Figure 2:
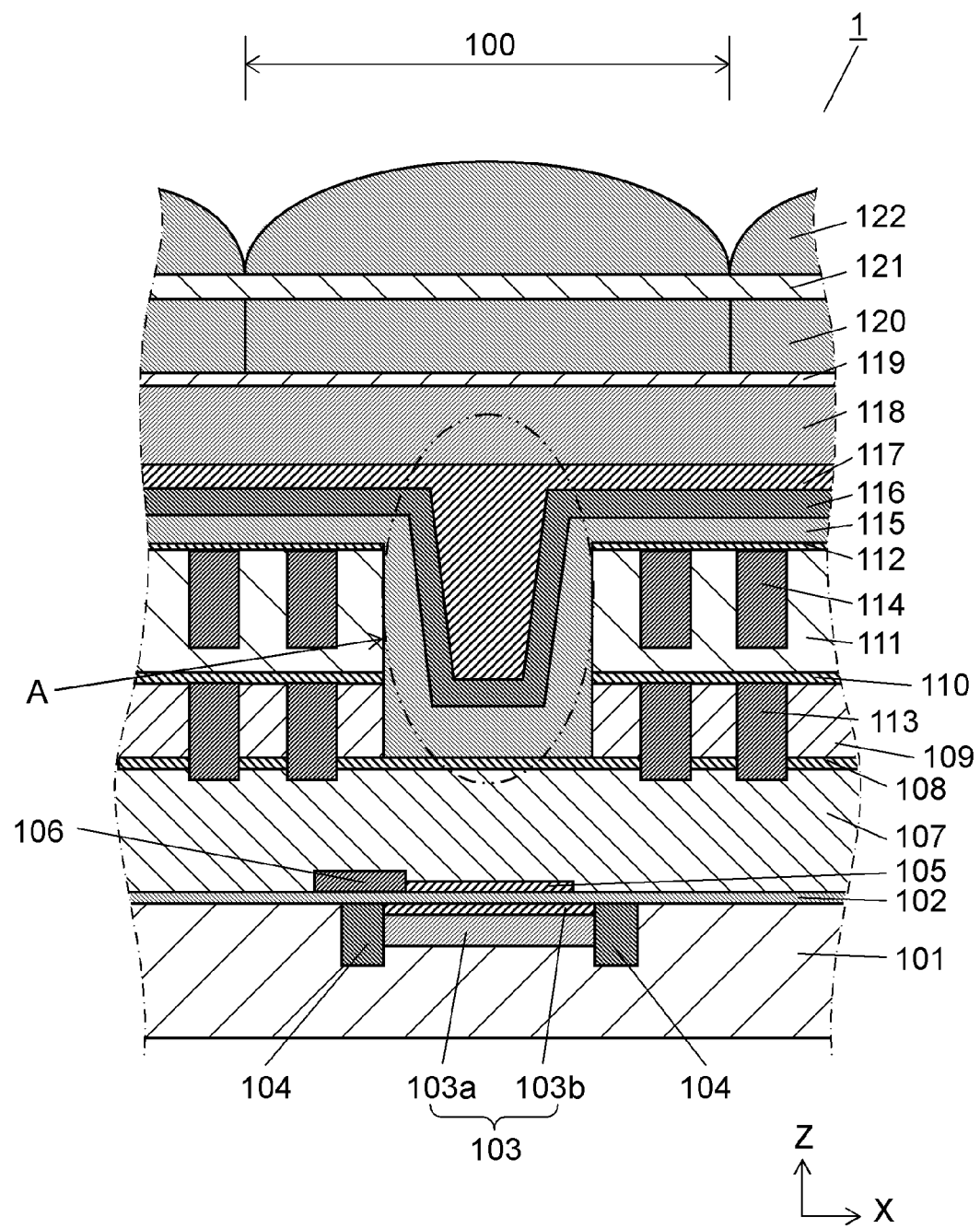
FIG. 2 is a schematic sectional view showing a structure in pixel part 100 of solid-state imaging device 1.

As shown in FIG. 2, solid-state imaging device 1 has gate insulating film 102 formed on a main surface of semiconductor substrate 101. Gate insulating film 102 is a silicon oxide ($SiO_2$) film, for example. Photodiode 103 is formed inward from an interface portion with gate insulating film 102 in semiconductor substrate 101. Photodiode 103 is constituted by a pn junction of n type charge storage layer 103a and p+ type surface layer 103b.

A width of photodiode 103 is 0.7 [μm] when a cell size of pixel part 100 is 1.4 [μm], for example.

An element isolating region 104 or the like is formed in addition to photodiode 103 in a surface layer portion of semiconductor substrate 101. Element isolating region 104 is formed by an ion implantation of an impurity such as boron into a corresponding portion of semiconductor substrate 101. Solid-state imaging device 1 also has a floating diffusion (FD) and a transistor element in each pixel part 100, and they are not shown in FIG. 2.

Antireflection film 105 and gate electrode 106 are formed in a portion corresponding to a portion provided above photodiode 103 on gate insulating film 102. Antireflection film 105 is formed of silicon nitride (SiN) or silicon oxynitride (SiON), for example, and is provided to prevent light incident on photodiode 103 from being reflected by a surface of semiconductor substrate 101.

Gate electrode 106 is formed of polysilicon or tungsten silicide, for example.

Next, insulating film (first insulating film) 107 is deposited on gate insulating film 102, and etching stop layer 108 is formed on insulating film 107. Insulating film 107 is formed of silicon oxide ($SiO_2$) and has a film thickness of 400 [nm], for example. Etching stop layer 108 is formed of silicon carbide, silicon carbide oxide, silicon nitride oxide or silicon nitride and has a film thickness of 50 [nm], for example.

Insulating film (first insulating film) 109, diffusion preventing film 110, insulating film (first insulating film) 111, and diffusion preventing film 112 are formed in a lamination on etching stop layer 108 in sequence. Wirings 113 and 114 are formed on respective insulating films 109 and 111. Insulating films 109 and 111 are also formed of silicon oxide ($SiO_2$) and has a film thickness of 300 [nm], for example. Insulating films 109 and 111 have a refractive index of 1.45, for example. In solid-state imaging device 1, a laminated product including insulating films 107, 109 and 111 and wirings 113 and 114 corresponds to the wiring layer. However, by setting the wiring layer to have a two-layer structure (wirings 113 and 114 form two layers), it is possible to reduce a posterior length of solid-state imaging device 1. In solid-state imaging device 1, consequently, it is possible to reduce an optical path for incident light and to enhance a sensitivity.

Diffusion preventing films 110 and 112 are formed of silicon carbide, silicon carbide oxide, silicon nitride oxide or silicon nitride and have a film thickness of 50 [nm] to 70 [nm], for example. Moreover, diffusion preventing films 110 and 112 have refractive indices of 1.7 to 2.0, for example. Diffusion preventing films 110 and 112 play a part in preventing a copper atom to be a material from being diffused to insulating films 109 and 111 when forming wirings 113 and 114.

Wirings 113 and 114 are formed by filling copper (Cu) or an alloy thereof in a trench which is previously formed on insulating films 109 and 111. At this time, it is also possible to employ a structure in which a barrier metal layer constituted by tantalum/tantalum nitride formed by a damascene process is provided on an outer periphery of a copper wiring. The barrier metal layer prevents the copper atom from being diffused to insulating films 109 and 111, and can also enhance an adhesion of insulating films 109 and 111 and the copper (Cu).

In insulating films 109 and 111 and diffusion preventing films 110 and 112, places corresponding to portions provided above photodiode 103 are opened and a concave portion is formed on the wiring layer (an A portion). Wirings 113 and 114 are not provided in the concave portion.

The concave portion in the wiring layer has an aspect ratio of 1 or less. It is desirable that a depth of the concave portion should be approximately 600 [nm] or less. The reason is as follows. It can be supposed that a void (hole) is generated in the concave portion when insulating films 115, 116 and 117 are to be formed by using an ordinary CVD method if the depth of the concave portion is set to be greater than 600 [nm]. In the case in which the void is generated in the concave portion, the void causes light to be scattered so that a sensitivity is considerably reduced. For this reason, it is desirable that the depth of the concave portion should be set to be approximately 600 [nm] or less.

In a state in which a side surface and a bottom surface which face the concave portion in the wiring layer are covered, second insulating film 115, third insulating film 116 and fourth insulating film 117 are formed in a lamination in sequence. Fourth insulating film 117 is formed to fill in the concave portion constituted by the side surface and the bottom surface in third insulating film 116 and an upper surfaceize in a Z-axis direction is formed almost flatly.

Second insulating film 115 is formed of silicon nitride (SiN), for example, and a film thickness from the bottom surface facing the concave portion (a surface of etching stop layer 108) is approximately 300 [nm]. A refractive index of second insulating film 115 formed of silicon nitride (SiN) is 1.9 to 2.0 which is higher than the refractive indices of insulating films 109 and 111.

Third insulating film 116 is formed of silicon oxynitride (SiON) and has a film thickness of approximately 10 [nm] to 100 [nm], for example. A refractive index of third insulating film 116 formed of silicon oxynitride (SiON) is 1.6 to 1.8, which is lower than that of second insulating film 115.

Fourth insulating film 117 is formed of silicon nitride (SiN) and a film thickness from the bottom surface of third insulating film 116 in the Z-axis direction is approximately 300 [nm], for example. A refractive index of fourth insulating film 117 is 1.9 to 2.0, which is higher than that of third insulating film 116.

The refractive indices of insulating films 109, 111, 115, 116 and 117 will be arranged as follows.

When the refractive indices of insulating films 109 and 111 are represented by n1, the refractive index of second insulating film 115 is represented by n2, the refractive index of third insulating film 116 is represented by n3 and the refractive index of fourth insulating film 117 is represented by n4, the following relationship is satisfied.

$$n2 > n1 \quad \text{[Equation 1]}$$

$$n3 < n2 \quad \text{[Equation 2]}$$

$$n4 > n3 \quad \text{[Equation 3]}$$

As shown in FIG. 2, subsequently, embedded layer 118, flattened resin layer 119, color filter 120, flattened film 121 and microlens 122 are formed on fourth insulating film 117 in sequence. Flattened resin layer 119 also functions as an adhesive layer for bonding color filter 120 formed thereon.

Color filter 120 transmits a light component in a wavelength region for any of red (R), green (G) and blue (B) every pixel part 100, for example.

3. Incident Path for Light in Solid-State Imaging Device 1

Figure 3:
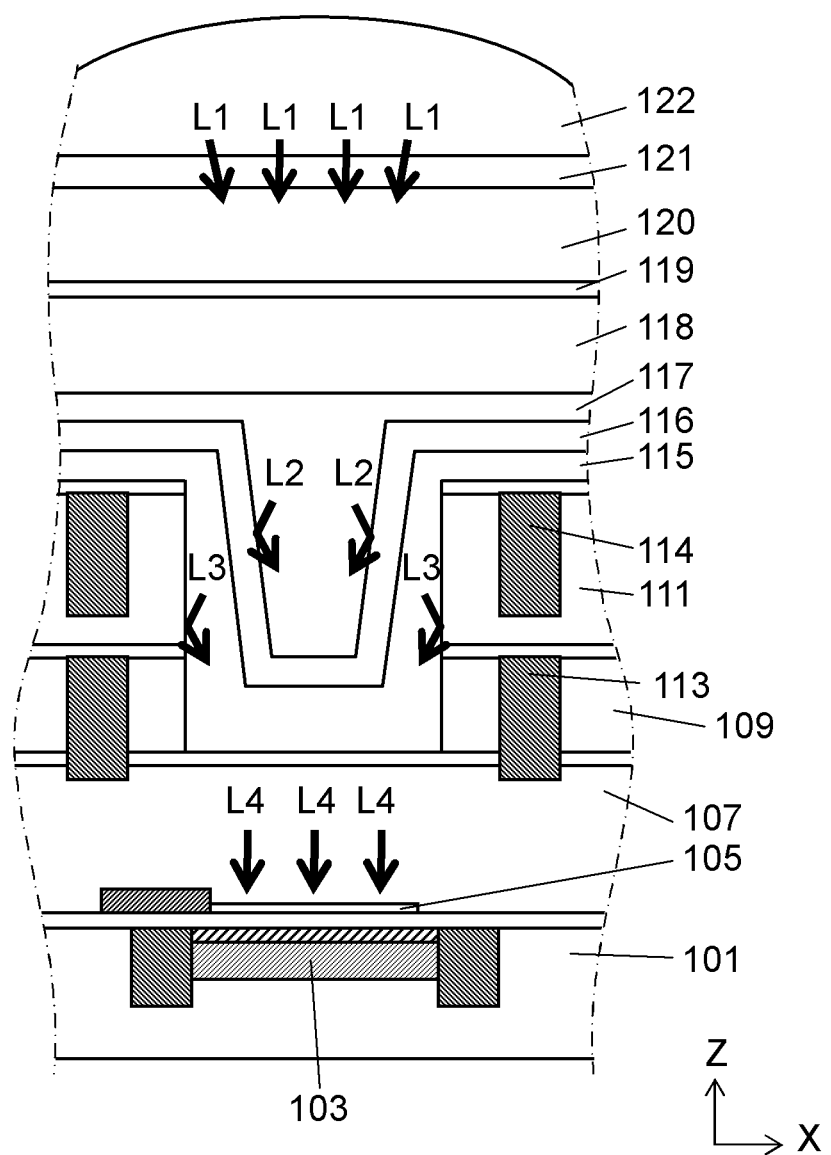
FIG. 3 is a schematic sectional view showing an incident path for light in solid-state imaging device 1.

An incident path for light in solid-state imaging device 1 will be described with reference to FIG. 3. FIG. 3 shows the incident path for the light in solid-state imaging device 1 according to the present embodiment.

First of all, as shown in FIG. 3, incident light is collected by microlens 122 (L1) and is transmitted through color filter 120 or the like, and is thus incident on the optical waveguide in solid-state imaging device 1 according to the present exemplary embodiment. Although a partial component of the light incident on the optical waveguide advances toward in a direction of the side wall, the incident light is reflected toward a fourth insulating film 117 side based on a difference in a refractive index between fourth insulating film 117 and third insulating film 116 (a relationship of the [Equation 3]) (L2).

Further, although the partial component of the light is transmitted through an interface between fourth insulating film 117 and third insulating film 116 and advances in a direction of the side surface facing the concave portion in the wiring layer, the light is reflected toward a second insulating film 115 side based on a difference in a refractive index between second insulating film 115 and insulating films 109 and 111 (a relationship of the [Equation 1]) (L3). Then, the light transmitted through the optical waveguide is incident on photodiode 103 (L4).

Figure 7:
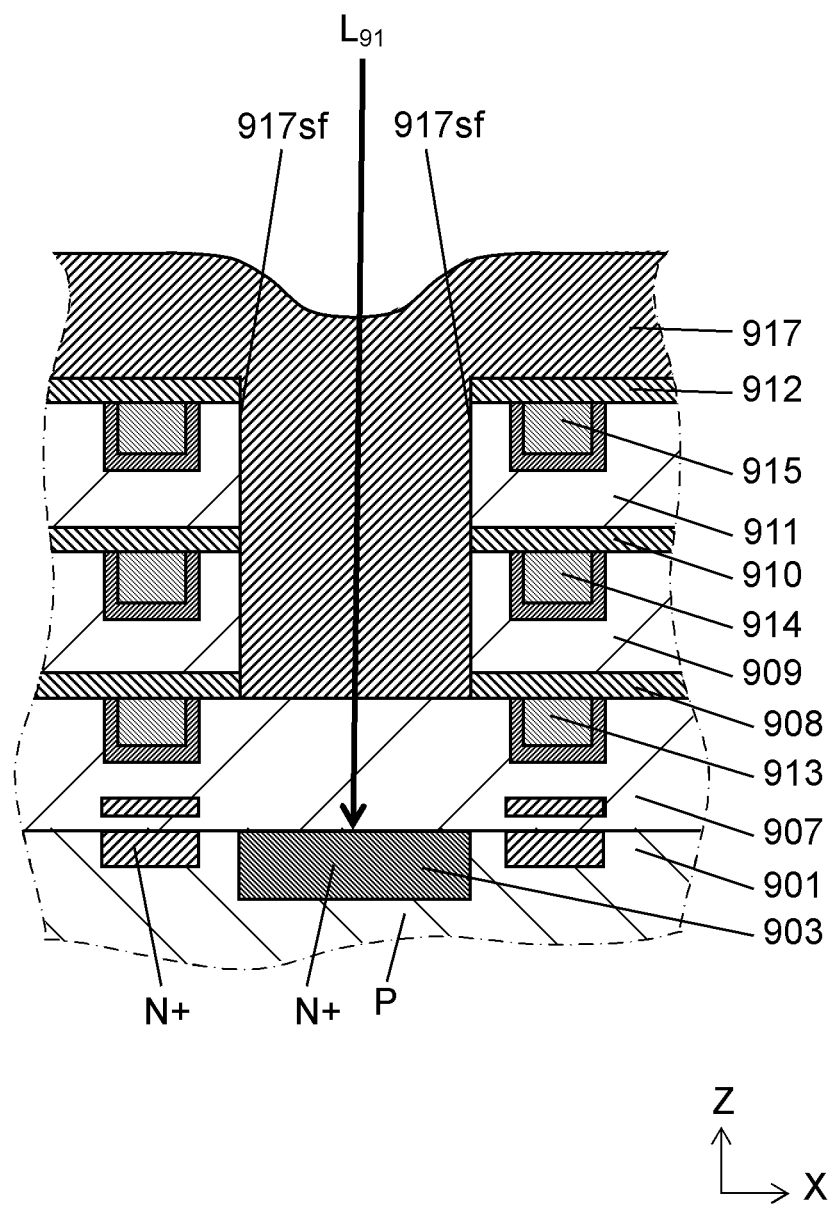
FIG. 7 is a schematic sectional view showing a part of a structure in a pixel part of a solid-state imaging device according to the related art.

On the other hand, as shown in FIG. 7, the incident light is constituted by passivation film 917 to be a core and insulating films 909 and 911 of the wiring layer to be a clad and the light is reflected by interface 917sf based on a mutual difference in a refractive index in the solid-state imaging device according to the related art.

However, in the solid-state imaging device according to the related art, the light leaking to the wiring layer is scattered by wirings 914 and 915. For this reason, the light which is transmitted through insulating film 907 and is incident on photodiode 903 formed on a surface layer of semiconductor substrate 901 is lessened more greatly than in the solid-state imaging device 1 according to the present exemplary embodiment shown in FIG. 3.

As described above, in solid-state imaging device 1 according to the present exemplary embodiment, three layers, that is, second insulating film 115, third insulating film 116 and fourth insulating film 117 are filled as cores in the concave portion formed on the wiring layer. For this reason, in solid-state imaging device 1 according to the present exemplary embodiment, it is possible to reduce the leakage of the light to the wiring layer very greatly by employing a double light confinement structure in the optical waveguide. Therefore, solid-state imaging device 1 according to the present exemplary embodiment has a higher light collection efficiency and a higher sensitivity than those in the solid-state imaging device according to the related art shown in FIG. 7.

Second Exemplary Embodiment

Figure 4:
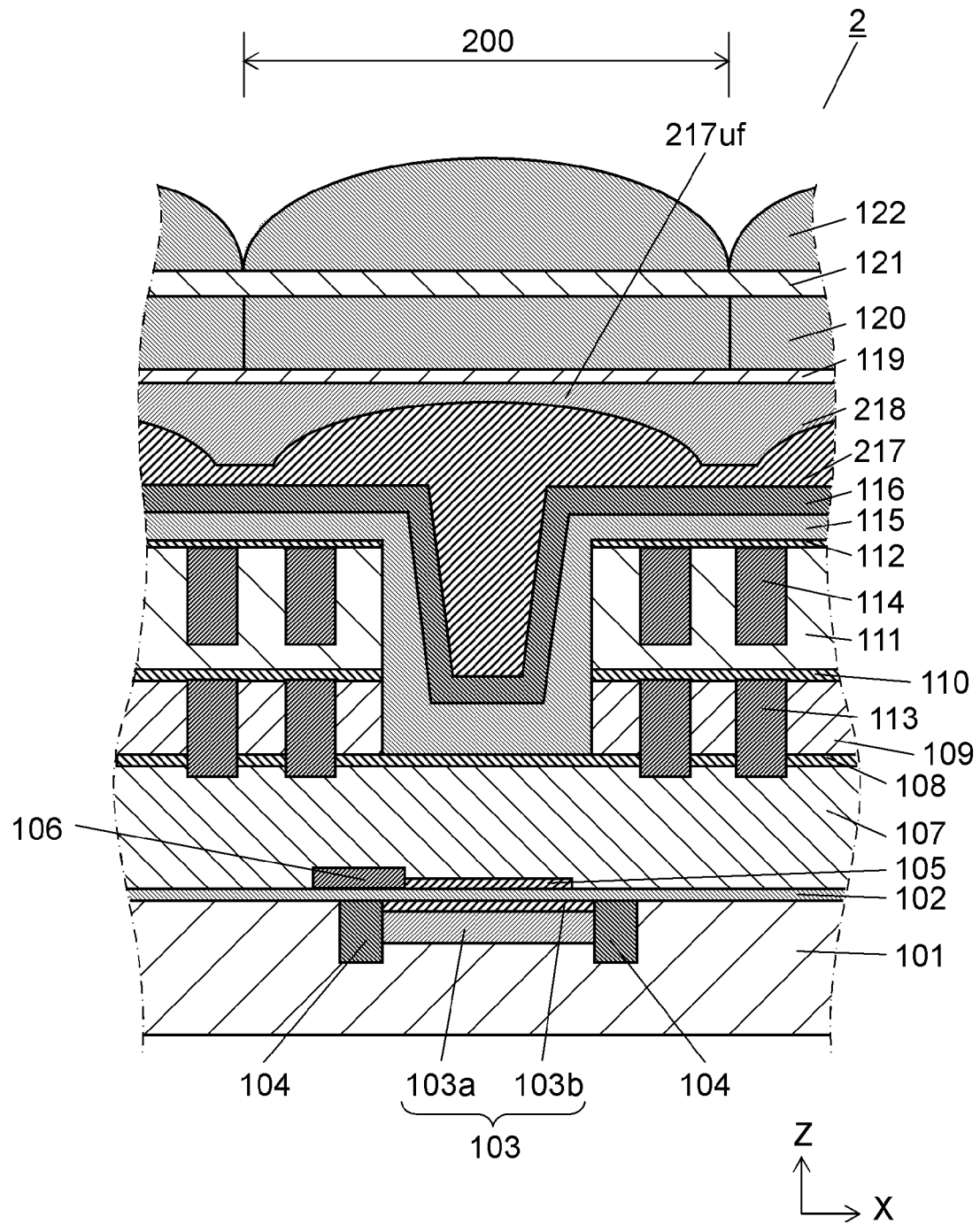
FIG. 4 is a schematic sectional view showing a structure in pixel part 200 of solid-state imaging device 2 according to a second exemplary embodiment of the invention.

Next, a structure of solid-state imaging device 2 according to a second exemplary embodiment will be described with reference to FIG. 4. FIG. 4 shows one pixel part 200 in a pixel region in the structure of solid-state imaging device 2 with being extracted, and structures other than the pixel region are the same as those in the first exemplary embodiment. Further, also in the following description, explanation of the same portions as those in the first exemplary embodiment will be omitted.

As shown in FIG. 4, in solid-state imaging device 2 according to the present exemplary embodiment, a shape of upper surface 217uf (a main surface on an upper side in a Z-axis direction) in fourth insulating film 217 is different from that of fourth insulating film 117 of solid-state imaging device 1 according to the first exemplary embodiment. More specifically, although the upper surface of fourth insulating film 117 is flat in solid-state imaging device 1 according to the first exemplary embodiment, the upper surface of fourth insulating film 217 takes an upward convex shape in solid-state imaging device 2 according to the present exemplary embodiment. In solid-state imaging device 2 according to the present exemplary embodiment, consequently, light collected by microlens 122 is further collected by means of an upward convex lens constituted over an interface between embedded layer 218 and fourth insulating film 217 and is thus guided to an optical waveguide.

Since a structure of the optical waveguide is the same as that in solid-state imaging device 1 according to the first exemplary embodiment except for the shape of upper surface 217uf of fourth insulating film 217, a further higher light collection efficiency can be implemented.

Third Exemplary Embodiment

Next, a structure of solid-state imaging device 3 according to a third exemplary embodiment will be described with reference to FIG. 5. Also in FIG. 5, one pixel part 300 in a pixel region in the structure of solid-state imaging device 3 is extracted, and structures other than the pixel region are the same as those in the first and second exemplary embodiments. Also in the following description, explanation of the same portions as those in the first and second exemplary embodiments will be omitted.

Figure 5:
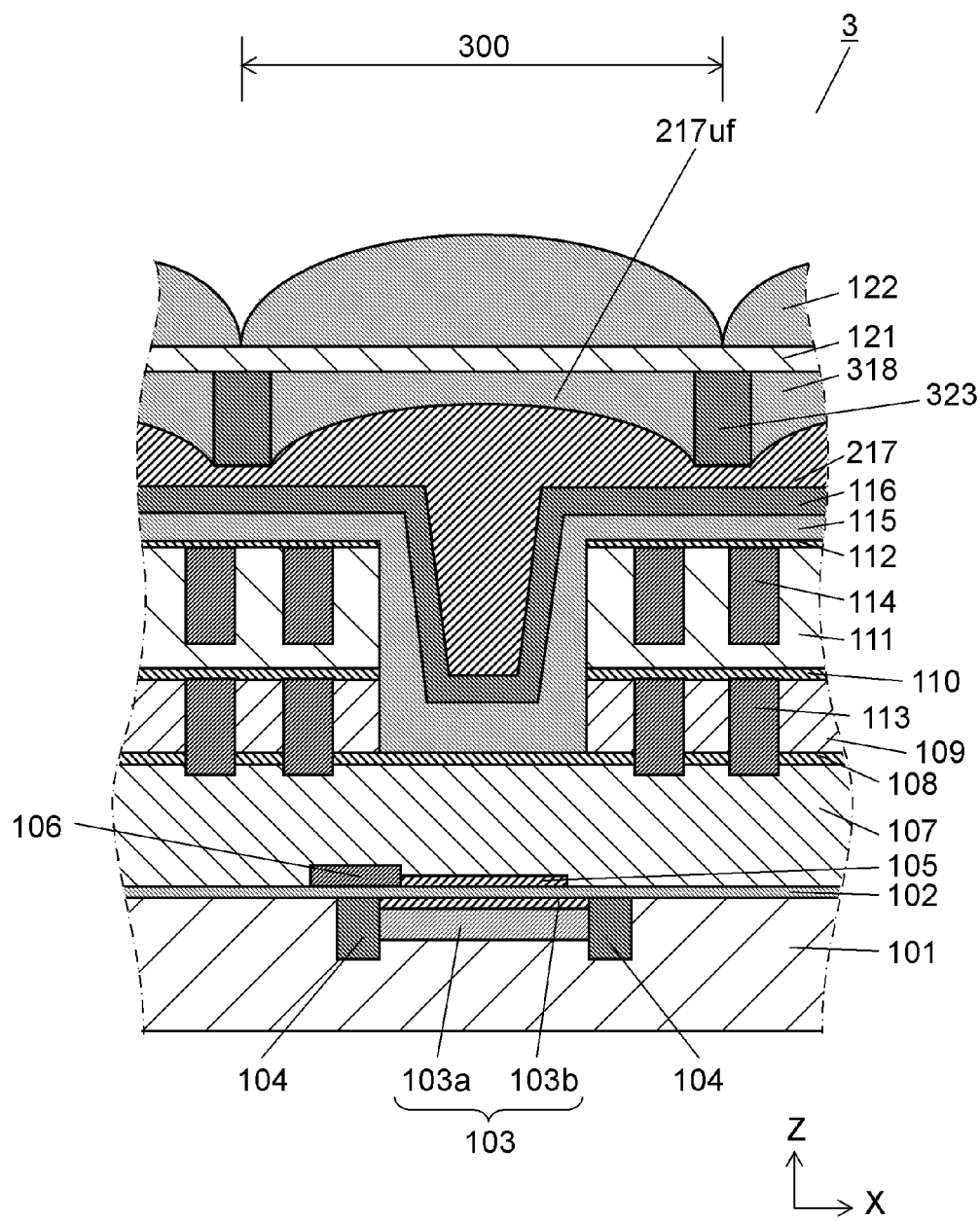
FIG. 5 is a schematic sectional view showing a structure in pixel part 300 of solid-state imaging device 3 according to a third exemplary embodiment of the invention.

As shown in FIG. 5, partition wall (fifth insulating film) 323 is formed in a boundary portion between adjacent pixel parts 300 over upper surface 217uf of fourth insulating film 217. Color filter 318 is formed on an inside of a region interposed between partition walls 323 over fourth insulating film 217. Partition wall 323 and color filter 318 are formed so as not to generate a clearance therebetween. Flattened film 121 and microlens 122 are formed in a lamination over a top portion of partition wall 323 and color filter 318.

When solid-state imaging device 3 is seen on a plane from an upper side in a Z-axis direction, partition wall 323 is formed like a grid and color filter 318 is set to have different transmission colors (R, G, B) for respective pixel parts 300.

For example, partition wall 323 is a CVD film (TEOS film) containing TEOS (Tetra Ethyl Ortho Silicate) as a raw material and has a refractive index of approximately 1.4 to 1.5. Although a refractive index of color filter 318 varies depending on a material to be used, the refractive index is approximately 1.6 to 1.7 usually.

Therefore, in solid-state imaging device 3 according to the present exemplary embodiment, even if a part of the light collected by microlens 122 tends to leak from a side surface of color filter 318 to color filter 318 in adjacent pixel part 300, the light is reflected by the interface because the refractive index of color filter 318 is higher than that of partition wall 323. Accordingly, in respect of a prevention of the leakage of the light to adjacent pixel part 300, solid-state imaging device 3 is more excellent than solid-state imaging device 2 according to the second exemplary embodiment.

Furthermore, light passing through a bottom surface color filter 318 tends t be diffracted and expanded in a lateral direction (an orthogonal direction to a Z axis). But, in solid-state imaging device 3 according to the present exemplary embodiment, the bottom surface of color filter 318 takes an upward convex shape and the light is not diffracted but collected into the optical waveguide as it is.

As described above, in solid-state imaging device 3 according to the present exemplary embodiment, there is employed the structure in which the formation of partition wall 323 prevents the leakage of the light to adjacent color filter 318 and a bottom surface of color filter 318 has a curvature in a whole region of pixel part 300 and is coincident with the upper film (fourth insulating film 217) in the optical waveguide of a lower portion. Consequently, it is possible to suppress the diffraction of the light in the lateral direction. Therefore, it is possible to further enhance a light collection ratio.

In the present exemplary embodiment, the upper surface of fourth insulating film 217 is set to be upper surface 217uf taking the upward convex shape which is the same as that in the second exemplary embodiment. However, it can also be a flat upper surface which is the same as that in the first exemplary embodiment. Also in the case in which the upper surface of fourth insulating film 217 is set to be flat, thus, it is possible to enhance the light collection ratio still more than that in the first exemplary embodiment.

Fourth Exemplary Embodiment

Next, a structure of solid-state imaging device 4 according to a fourth exemplary embodiment will be described with reference to FIG. 6. Also in FIG. 6, one pixel part 400 in a pixel region in the structure of solid-state imaging device 4 is extracted, and structures other than the pixel region are the same as those in the first, second and third exemplary embodiments. Also in the following description, explanation of the same portions as those in the first, second and third exemplary embodiments will be omitted.

Figure 6:
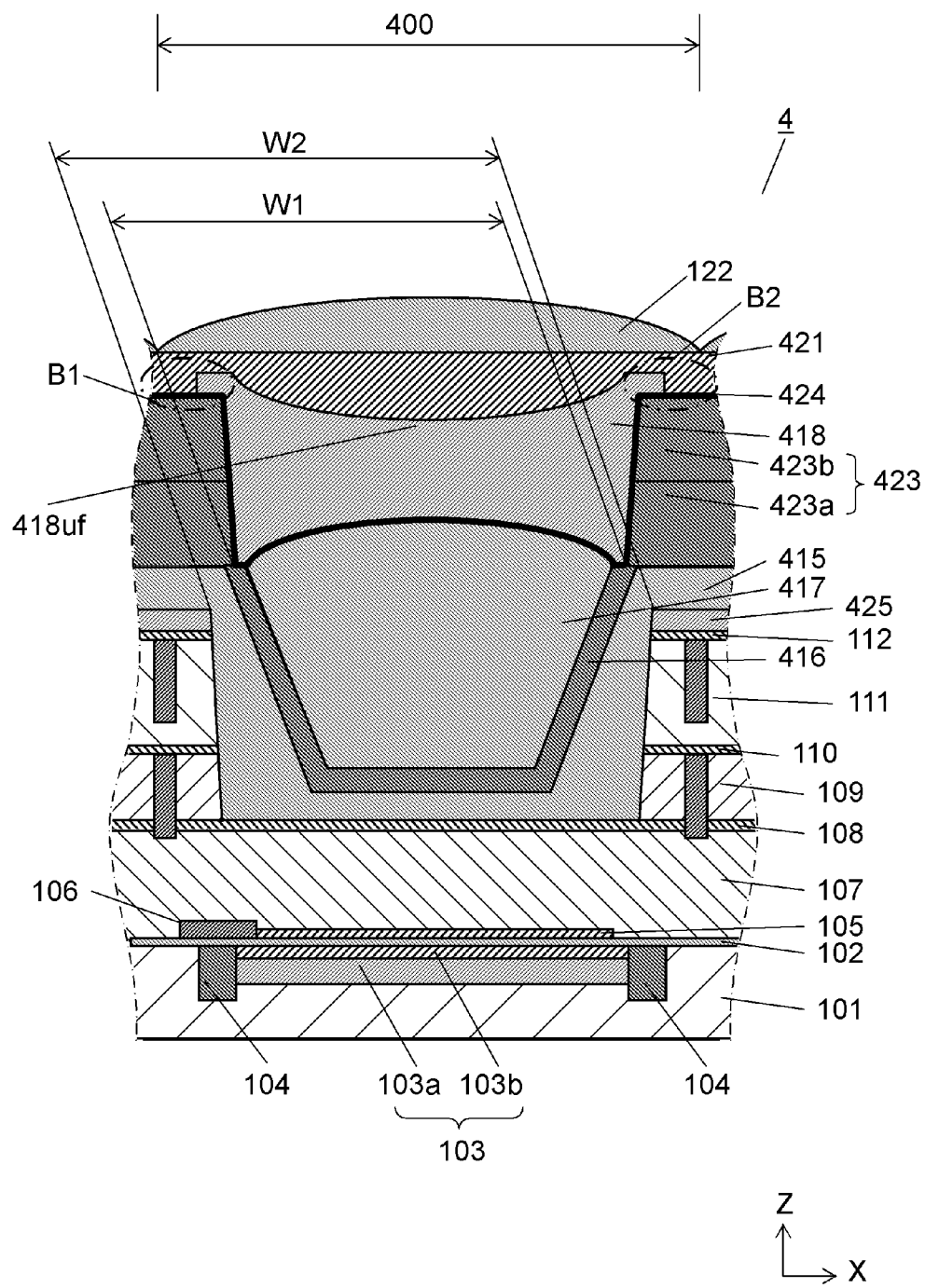
FIG. 6 is a schematic sectional view showing a structure in fourth pixel part 400 of solid-state imaging device 4 according to a fourth exemplary embodiment of the invention.

As shown in FIG. 6, in solid-state imaging device 4 according to the present exemplary embodiment, insulating film 425 is provided on diffusion preventing film 112 and a wiring layer is constituted to include insulating film 425. Second insulating film 415 is provided on insulating film 425 in the wiring layer and partition wall 423 is erected thereon. In other words, in the present exemplary embodiment, neither third insulating film 416 nor fourth insulating film 417 are not provided on insulating film 425 in the wiring layer.

Insulating film 425 is formed of silicon oxide ($SiO_2$) and has a film thickness of 80 [nm] to 120 [nm], for example. More specifically, insulating film 425 has a film thickness of 100 [nm]. A film thickness of second insulating film 415 is 200 [nm] to 400 [nm] over insulating film 425, more specifically, 300 [nm].

Furthermore, in solid-state imaging device 4 according to the present exemplary embodiment, partition wall 423 for dividing color filters 418 between adjacent pixel parts 400 has a structure in which lower layer 423a and upper layer 423b are provided in a Z-axis direction, and takes a trapezoidal section in which an upper side has a smaller width than a lower side. Both lower layer 423a and upper layer 423b which constitute partition wall 423 are TEOS films, and have refractive indices of approximately 1.4 to 1.5. Further, in partition wall 423, an interface is present between lower layer 423a and upper layer 423b and plays a part in reflecting light advancing in partition wall 423 downward from an upper side in the Z-axis direction over the interface, thereby preventing a downward entrance.

In partition wall 423, a height is set to be 600 [nm] to 800 [nm], a width of an upper portion is set to be 150 [nm] to 250 [nm], and a width of a lower portion is set to be 200 [nm] to 400 [nm]. More specifically, the height is set to be 700 [nm], the width of the upper portion is set to be 200 [nm], and the width of the lower portion is set to be 300 [nm].

Further, in solid-state imaging device 4 according to the present exemplary embodiment, a virtual line extended downward in the Z-axis direction along an inner inclined surface of partition wall 423 passes through an inner side of an upper end of the optical waveguide in opening width W1 at a lower end of partition wall 423 and opening width W2 at an upper end of the optical waveguide. Consequently, the light passing through color filter 418 is guided to the optical waveguide without a leakage. In this case, it is preferable that a side wall of partition wall 423 and a side wall of the optical waveguide should be inclined, respectively. By applying the inclination, the light can easily be collected into the vicinity of a center of photodiode 103 in a surface layer of a substrate.

When a cell size of pixel part 400 is set to be 1.4 [μm], width W1 is 1000 [nm] to 1200 [nm] and width W2 is 900 [nm] to 1200 [nm]. More specifically, both of widths W1 and W2 are 1100 [nm].

Further, as shown in FIG. 6, adhesion layer 424 is formed on an upper surface of an upward convex-shaped portion between partition walls 423 in fourth insulating film 417 and an external surface of partition wall 423. Adhesion layer 424 is constituted by an organic material such as an epoxy resin and has a film thickness of approximately 1 [nm], for example. In order to enhance an adhesive property of partition wall 423 (to be a TEOS film) formed by an inorganic material and color filter 418 formed by an organic material, adhesion layer 424 is provided therebetween. Adhesion layer 424 may be formed of HMDS (hexamethyldisilazane) in addition to the epoxy resin, for example.

Color filter 418 provided between adjacent partition walls 423 has a structure in which upper surface 418uf takes a concave shape and a concave lens is formed on an interface with flattened film 421 laminated thereon. Consequently, light turned in an oblique direction so as to be collected by microlens 122 is changed into a perpendicular direction to photodiode 103. Thus, it is possible to enhance a light collection ratio still more.

As shown in FIG. 6, in solid-state imaging device 4, a part of color filter 418 is brought into an overriding state onto a top surface of partition wall 423 (B1 part, B2 part). However, color filters 418 of adjacent pixel parts 400 are separated from each other and are provided in non-contact with each other.

In solid-state imaging device 4 having the structure described above, it is possible to obtain all of the advantages produced by solid-state imaging devise 1 to 3 according to the first to third exemplary embodiments, and furthermore, it is possible to reliably guide the incident light from color filter 418 to the optical waveguide based on the relationship between widths W1 and W2.

(Other Matters)

The first to fourth exemplary embodiments are examples used for easy understanding of the structures and the functions and effects according to the present invention, and the present invention is not restricted to the modes illustrated in the first to fourth exemplary embodiments except for the essential features thereof. Although FIG. 1 shows the mode in which pixel parts 100 are arranged in a matrix in pixel region 10, for instance, the arrangement mode of pixel parts can also take a shape of a honeycomb as well as the shape of the matrix.

Although the three insulating layers are formed in a lamination in the concave portion formed on the wiring layer in the first to fourth exemplary embodiments, at least four insulating layers may be formed in a lamination. Although second insulating films 115 and 415, third insulating films 116 and 416 and fourth insulating films 117, 217 and 417 are also laminated in sequence over the bottom surface of the wiring layer facing the concave portion (the upper surface of etching stop layer 108 in FIG. 2 or the like) in the first to fourth exemplary embodiments, the lamination of the second insulating film, the third insulating film and the fourth insulating film on the bottom surface is not essential. In other words, if the second insulating film, the third insulating film and the fourth insulating film are provided in sequence over the side surface of the wiring layer facing at least the concave portion, it is possible to obtain the effects described above.

Furthermore, an in-layer lens can also be provided between the microlens and the color filter. In this case, it is possible to further increase the light collection ratio.

The present invention is useful for implementing a solid-state imaging device acting as an imaging device to be provided on a digital still camera, a video camera or the like.

What is claimed is:

1. A solid-state imaging device comprising:
   a semiconductor substrate in which a light receiving part having a photoelectric converting function is formed in an inner portion;
   a wiring layer having a lamination structure including a first insulating film and a wiring, formed above the semiconductor substrate, and provided with a concave portion in a place corresponding to a portion disposed above the light receiving part;

a second insulating film having a higher refractive index than the first insulating film and formed in such a state as to cover at least a side surface of the wiring layer facing the concave portion;

a third insulating film having a lower refractive index than the second insulating film and formed in such a state as to cover at least a side surface of the second insulating film corresponding to the side surface of the wiring layer facing the concave portion;

a fourth insulating film having a higher refractive index than the third insulating film and formed in such a state as to cover at least a side surface of the third insulating film corresponding to the side surface of the second insulating film; and an optical waveguide having a double light confinement structure constituted by portions of the second, third and fourth insulting films formed in the concave portion.

2. The solid-state imaging device according to claim 1, wherein the second insulating film is formed in such a state as to also cover a bottom surface of the concave portion, the third insulating film is formed in such a state as to also cover a bottom surface of the second insulating film corresponding to the bottom surface of the concave portion, and the fourth insulating film is formed in such a state as to also cover a bottom surface of the third insulating film corresponding to the bottom surface of the second insulating film.

3. The solid-state imaging device according to claim 1, wherein the fourth insulating film is formed in such a state as to fill a concave portion which is left on an inside of the side surface of the third insulating film in the concave portion of the wiring layer, and the place corresponding to the portion disposed above the light receiving part is formed to take an upward convex shape.

4. The solid-state imaging device according to claim 3, wherein a grid-shaped partition wall having the opened place corresponding to the portion disposed above the light receiving part is provided on the fourth insulating film, and a color filter is embedded in the opening.

5. The solid-state imaging device according to claim 4, wherein the fourth insulating film has a higher refractive index than the color filter.

6. The solid-state imaging device according to claim 4, wherein the partition wall is formed of an oxide.

7. The solid-state imaging device according to claim 1, wherein the second insulating film is formed of silicon nitride.

8. The solid-state imaging device according to claim 1, wherein the fourth insulating film is formed of silicon nitride.

9. The solid-state imaging device according to claim 1, wherein the third insulating film is formed of silicon oxide or silicon oxynitride.

* * * * *